United States Patent [19]

Morimoto

[11] 4,140,610

[45] Feb. 20, 1979

[54] METHOD OF PRODUCING A PN JUNCTION TYPE SOLAR BATTERY

[75] Inventor: Kiyoshi Morimoto, Mobara, Japan

[73] Assignee: Futaba Denshi Kogyo Kabushiki Kaisha, Chiba, Japan

[21] Appl. No.: 809,863

[22] Filed: Jun. 24, 1977

[30] Foreign Application Priority Data

Jun. 28, 1976 [JP] Japan ................................. 51-75424

[51] Int. Cl.² ...................... C23C 15/00; H01L 31/06
[52] U.S. Cl. .................. 204/192 N; 29/572; 136/89 SJ; 136/89 CC; 357/30; 148/174; 148/175
[58] Field of Search ..................... 136/89 SJ, 89 CC; 29/572; 204/192 N; 357/30; 427/74, 75, 82, 86, 85; 148/174, 175

[56] References Cited

U.S. PATENT DOCUMENTS

| | | | |
|---|---|---|---|
| 3,171,068 | 2/1965 | Denkewalter et al. | 317/234 |
| 3,936,319 | 2/1976 | Anthony et al. | 136/89 |
| 3,994,012 | 11/1976 | Warner, Jr. | 357/30 |
| 4,055,442 | 10/1977 | Crosher | 136/89 CC |

OTHER PUBLICATIONS

T. Takagi et al., "Ionized Cluster Beam Deposition," *J. Vac. Sci. Technol.*, vol. 12, pp. 1128–1134, (1975).

*Primary Examiner*—John H. Mack
*Assistant Examiner*—Aaron Weisstuch
*Attorney, Agent, or Firm*—Oblon, Fisher, Spivak, McClelland & Maier

[57] ABSTRACT

A PN junction type solar battery comprising a plurality of alternate P-type and N-type semiconductor layers provided in a laminated manner parallel to an incident-light-receiving plane, connection ears provided opposite to each other and integrally connected to one end of each of the P-type and N-type semiconductor layers respectively, the connection ears being made of material of the same conduction type as the semiconductor layers respectively, and terminal electrodes mounted on the connection ears of the P-type and N-type semiconductor layers respectively so as to obtain ohmic contact therebetween.

A method of producing a PN junction type solar battery in which P-type and N-type semiconductor layers are formed on a substrate in a staggered manner relative to each other preferably by the ion-beam deposition method or the cluster-ion-beam deposition method.

2 Claims, 7 Drawing Figures

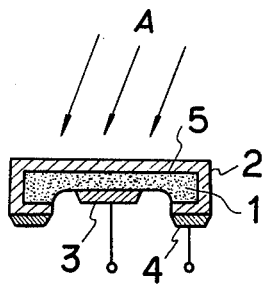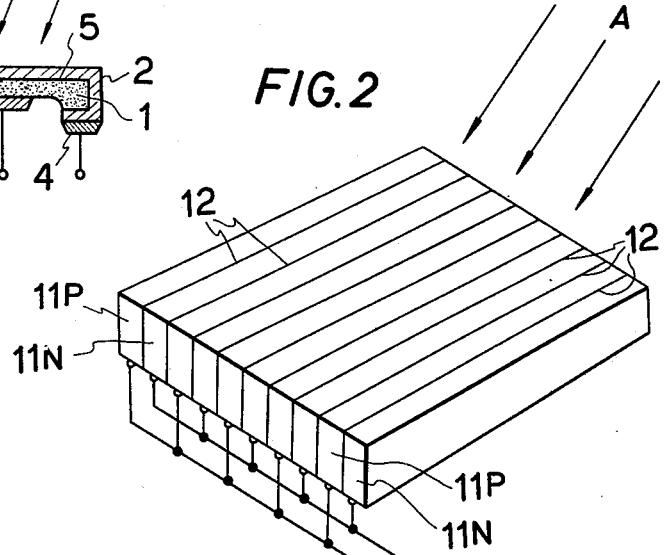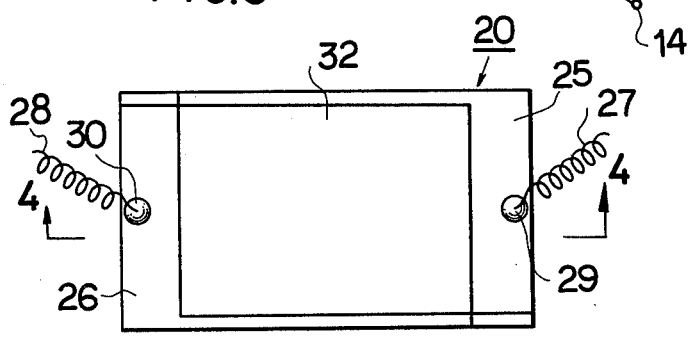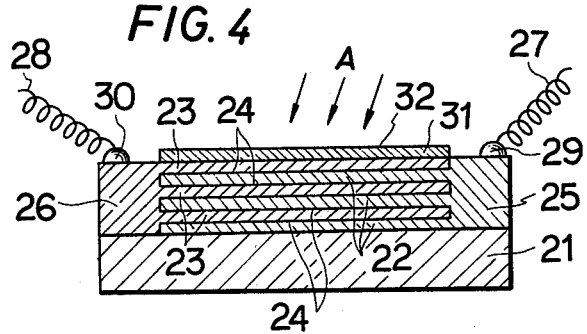

METHOD OF PRODUCING A PN JUNCTION TYPE SOLAR BATTERY

BACKGROUND OF THE INVENTION

1. Field of the Invention

The present invention relates to a PN junction type solar battery and, more particularly, to a solar battery consisting mainly of PN junction semiconductor elements and a method of producing the same.

2. Description of the Prior Art

A conventional solar battery of this type heretofore well known will be hereinafter described with reference to FIG. 1.

As shown, a conventional solar battery has an N-type silicon substrate 1, a P-type diffused layer 2 formed on the surface of the silicon substrate 1, and terminal electrodes 3 and 4 provided on the rear side of the N-type board 1 and on a part of the P-type diffused layer 2, respectively, in ohmic contact therewith so that the photoelectromotive force may be obtained.

In the case of such a conventional solar battery, however, the PN junction 5 is formed at a deep position relative to the plane on which light rays A are incident the surface of the P-type layer 2 and therefore electron-hole pairs produced by the light rays A are mostly recombined and disappear before reaching the above-mentioned junction 5 and thereby the photoelectric conversion efficiency is extremely deteriorated. Especially, almost all the electron-hole pairs produced in the vicinity of the surface of the P-type layer are recombined before reaching the above junction 5, and therefore the photoelectric conversion efficiency for the short wavelength components of the incident rays of light A is inevitably very low.

In other words, the conventional solar battery of the type such as shown in FIG. 2 carries out the conversion of only the long wavelength components of the light rays having the spectral distribution curve "a" shown in FIG. 7, as shown by the dot-dash curve "b".

In order to improve the conversion efficiency of the light rays in the short wavelength region, meanwhile, an improved version of the solar battery shown in FIG. 1 is known in which the P-type layer 2 is formed by special film-making techniques such as gaseous- or liquid-phase epitaxy, evaporation and ion injection.

In the case of the solar battery which has the P-N junction 5 formed by the above-mentioned film-making techniques, however, the electron-hole pairs produced at the positions deeper than the junction 5 by long wavelength rays of light are recombined before reaching the junction 5 and therefore the conversion efficiency is lowered in the long wavelength region; accordingly, though the photoelectric conversion characteristic is very much improved in the short wavelength region as shown in FIG. 7 by the broken curve "c", it is not improved as a whole.

Besides the above-mentioned solar battery as shown in FIG. 1, what is called the vertical multi-junction solar cell has recently been developed. As shown in FIG. 2, the solar battery of this type has a number of P-type layers 11P and N-type layers 11N formed alternately with each other, the P-N junctions 12 thereof being vertical to the plane on which the rays of light A are incident; accordingly, if the thicknesses of the above P-type layer 11P and N-type layer 11N are made less than twice the diffusion length of the respective minority carriers, almost all the electron-hole pairs produced at positions deep in the battery as well as in the vicinity of the light-receiving plane will be transported to the P-N junction 12 thereby to remarkably improve the photoelectric conversion efficiency.

In such a solar battery as shown in FIG. 2, the thickness of each layer inevitably becomes small for the above-mentioned structural reason and is desirably less than twice the diffusion length of the minority carriers therein; therefore a solar battery of this type requires in its production a very difficult-to-perform technique for controlling the layer thickness and providing terminals 13 and 14; for this reason, it cannot be mass-produced as yet and therefore is expensive.

In view of the above-mentioned drawbacks, the present invention contemplates the elimination of the above-mentioned disadvantages of the prior art and to provide a novel solar battery.

SUMMARY OF THE INVENTION

It is an object of the present invention to provide a P-N junction type solar battery which can convert the sunlight incident thereon into electric signals over a wide range of wavelengths, and a method of producing the same.

It is another object of the present invention to provide a P-N junction type solar battery which is suitable for mass production, and a method of producing the same.

It is still another object of the present invention to provide a solar battery in which terminal electrodes can be very easily mounted.

According to the present invention, there is provided a P-N junction type solar battery comprising a semiconductor element section composed of a plurality of alternate P-type and N-type semiconductor layers provided in a laminated manner parallel to the light-receiving plane of the battery. Connection ears are provided opposite to each other and are integrally connected to opposite ends of the P-type and N-type semiconductor layers, respectively, the connection ears being made of material of the same conduction type as the above semiconductor layers respectively, and terminal electrodes are mounted on the connection ears of the P-type and N-type semiconductor layers respectively so as to obtain ohmic contact therewith.

According to another aspect of the present invention, there is provided a method of producing the above-mentioned P-N junction type solar battery which comprises the steps of forming a plurality of alternate P-type and N-type semiconductor layers in a laminated manner so that they are staggered relative to each other, and mounting terminal electrodes on the staggered connection ears of the P-type and N-type semiconductor layers respectively so as to obtain an ohmic contact therewith.

According to a preferred aspect of the present invention, there is provided a method of producing the above solar battery wherein the above P-type and N-type semiconductor layers and both connection ears are formed in a laminated manner by the ion-beam deposition process or cluster-ion-beam deposition process.

BRIEF DESCRIPTION OF THE DRAWINGS

FIG. 1 is a sectional view of an example of a conventional P-N junction type solar battery;

FIG. 2 is a perspective view of another example of a conventional PN junction type solar battery;

FIG. 3 is a plan view of a PN junction type solar battery according to one embodiment of the present invention;

FIG. 4 is a sectional view taken along the line 4—4 of FIG. 3;

DESCRIPTION OF THE PREFERRED EMBODIMENTS

Figure 5:
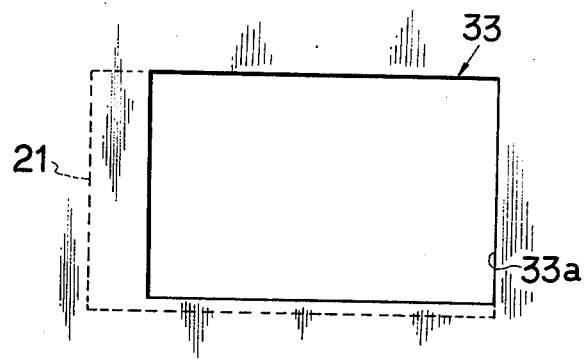
FIGS. 5 and 6 are explanatory views of the production process according to the present invention.

Now the present invention will be hereinafter described with reference to the accompanying drawings.

Reference is made to FIGS. 3 and 4, which show one embodiment of the present invention. Reference numeral 21 designates a substrate which acts as the base plate of a solar battery 20. Substrate 21 may be made of silicon, sapphire, glass, ceramics or the like.

A plurality of N-type semiconductor layers 22 and P-type semiconductor layers 23 are alternately deposited and formed on the upper surface of the substrate 21 in a laminated manner and in parallel with a plane on which light rays A are incident; thus a plurality of PN junction 24 are formed.

The outside edges of the N-type semiconductor layers 22 and P-type semiconductor layers 23 are staggered relative to each other in the opposite directions. Connection ears 25 and 26, which are made of the same semiconductor materials as the foregoing N-type and P-type layers 22 and 23 respectively, connect together the above-mentioned staggered outside edges of the respective N-type and P-type semiconductor layers 22 and 23.

Terminal electrodes 29 and 30, which have leads 27 and 28 respectively, are mounted on a part of the connection ear 25 of the N-type semiconductor layer 22 and a part of the connection ear 26 of the P-type semiconductor layer 23 by evaporation or the like, respectively, so that an ohmic contact may be obtained therebetween.

The terminal electrode 29 formed on the connection ear 25 of the N-type semiconductor layer 22 may be made of an alloy containing components for forming N-type material, for instance, gold antimonide, or aluminum, etc; the terminal electrode 30 formed on the connection ear 26 of the P-type semiconductor layer 23 may be made of an alloy containing components for forming P-type material, for instance, indium alloy, or indium itself, aluminum or the like.

On the upper surface of the topmost one of the P-type semiconductor layers 23, there is provided an anti-reflection layer 31 for preventing the reflection of incident rays of light and efficiently directing the incident rays of light into the semiconductor layers. Thus a light-receiving surface 32 is formed on the top of the anti-reflection layer 31.

Figure 6:
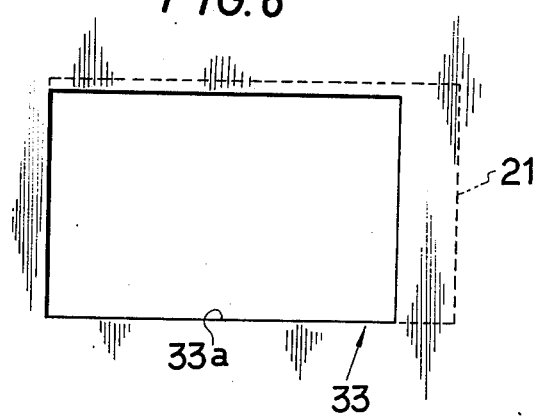

Reference is now made to FIGS. 5 and 6, which are explanatory views of the process for forming the P-type and N-type semiconductor layers 22 and 23 according to the above embodiment of the present invention. The following is a description on a preferred embodiment of the method of producing the above-mentioned solar battery.

Reference numeral 33 designates a mask having an opening 33a for forming the semiconductor layers. The opening 33a corresponds in size to the shape-in-plan of the P-type semiconductor layer 23 and its connection ear 26 or the N-type semiconductor layer 22 and its connection ear 25. The opening 33a must be smaller than the surface area of the substrate 21.

As shown in FIG. 5, the mask 33 is first set on the upper surface of the substrate 21. Under the influence of the opening 33a of the mask 33, the lowermost N-type semiconductor layer 22 and its connection ear 25 are integrally and simultaneously formed in a film form.

Then mask 33 similar to the above is set at a position slightly shifted from the above and on the surface of the lowermost N-type semiconductor layer 22 formed in the above-mentioned manner on the substrate 21. Thus the next P-type semiconductor layer 23 and its connection ear 26 are formed in a similar manner.

By repeating the above procedure, the laminated semiconductor element section of the solar battery such as shown in FIG. 3 is formed on the substrate 21.

Then the terminal electrodes 29 and 30 are formed on the semiconductor element section in ohmic contact therewith by evaporation or the like. External leads 27 and 28 are connected to the terminal electrodes 29 and 30, respectively, to provide output of the photoelectromotive force. Finally the anti-reflection layer 31 is formed. Thus the solar battery 20 shown in FIG. 4 is formed. It is noted that the anti-reflection layer 31 may be formed before forming the terminal electrodes 29 and 30.

In the above embodiment, each N-type semiconductor layer 22 and its connection ear 25 and each P-type semiconductor layer 23 and its connection ear 26 may be formed by any suitable film-forming method. In order to produce a layer having good crystallinity, however, it is desirable to use the usual ion-beam deposition method or the cluster-ion-beam deposition method which is a kind of ion-beam deposition method.

The above-mentioned cluster-ion-beam deposition method is a film-forming method comprising the steps of evaporating a material-to-be-deposited (semiconductor material, in this case), jetting the evaporated material into a vacuum region about $10^{-2}$ Torr or less to form groups of aggregated atoms called clusters, bombarding the clusters with electrons to ionize at least a part thereof, and accelerating the ionized clusters by an electric field to make them impinge on the upper surface of the substrate thereby forming a layer of the above material on the substrate.

According to the cluster-ion-beam deposition method, the surface of the substrate is at all times kept clean since the sputtering-and-cleaning action is continuously performed thereon by the action of cluster ions impinging thereon; therefore a very clean film high in adhesiveness can be deposited. In addition, the cluster ions have a very small charge-to-mass ratio "e/m", and therefore a film excellent in adhesiveness and purity can be deposited on a substrate made of each of various insulators on which it has been almost impossible to deposit a film by evaporation.

When the light rays A are incident on the solar battery 20 thus formed, the short wavelength components of the incident light A are absorbed in the vicinity of the light-receiving surface 32 to form electron-hole pairs; meanwhile the long wavelength components are absorbed at deeper positions to form electron-hole pairs. In this solar battery 20, electron-hole pairs produced at any depth of the multi-layer N-type and P-type semiconductor layers 22 and 23 are not recombined in the course of diffusion and can move across the junctions 24, because the P-N junctions 24 are positioned close to each other. Besides, the P-N junctions 24 are formed on both surfaces of each of the semiconductor layers 22 and 23 and, as a result, the probability of the electron-hole pairs reaching the P-N junctions becomes very high. In this manner, electromotive force is created at each junction 24, being taken out through the terminal electrodes 29 and 30 and leads 27 and 28. As is apparent from the double-dot-and-dash curve "d" shown in FIG. 7, the solar battery of the present invention can perform photoelectric conversion over a wide wavelength range of the incident light A.

Figure 7:
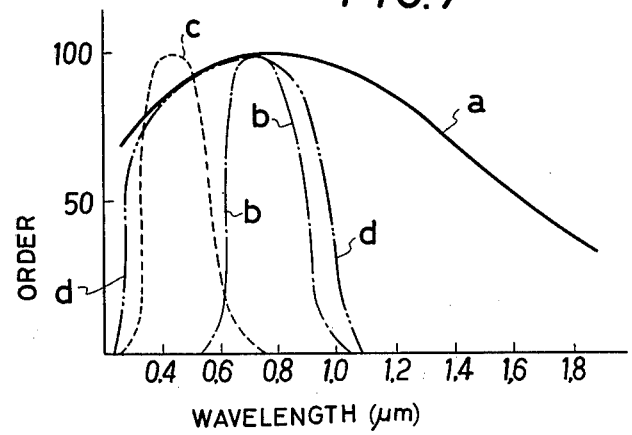
FIG. 7 is a diagram showing the photoelectric conversion characteristics of the conventional and novel PN junction type solar batteries.

In FIG. 7, which shows the photoelectric conversion characteristic, the convertible limit at the long wavelength side is determined by the band gap or energy gap of the semiconductor material to be used. When silicon is used as the semiconductor material, the convertible limit is about 1.14 μm at the long wavelength side.

In the embodiment shown in FIG. 4, one semiconductor element section is provided on one substrate. However, it is obvious that a plurality of semiconductor element sections may be provided on one substrate and may be connected in series or in parallel so as to obtain a desired voltage and current.

The shape of the mask 33 for forming the connection ear 25 or 26, on which the electrode 29 or 30 is mounted and which is formed by laminating the semiconductor layers of the same conduction type as the electrode 29 or 30, can be properly selected as occasion demands, together with other various factors.

As mentioned above, the solar battery of the present invention has a plurality of alternate P-type and N-type semiconductor layers formed parallel with the plane on which the rays of light are incident, and therefore all the electron-hole pairs produced in the vicinity of the light receiving surface and at deep positions distant therefrom can move across the P-N junctions without being subject to recombination. Accordingly, the solar battery of the present invention can have a photoelectric conversion ability over a wide frequency range of incident light and thereby can remarkably improve the conversion efficiency.

Moreover, the solar battery of the present invention has the P-type and N-type semiconductor layers slightly shifted from each other, and therefore the semiconductor layers of the same conduction type are formed at either end and can be collectively made into a connection ear. As a result, the photoelectromotive force can be outputted through the connection ears formed of the semiconductor layers of the same conduction type, and therefore the terminal electrodes can be very easily formed thereby enabling the mass-production of the solar battery of the present invention.

According to the present invention, each of the P-type and N-type semiconductor layers may be formed by the ion-beam deposition method or cluster-ion-beam deposition method; therefore a semiconductor layer very thin and excellent in crystallinity may be formed while controlling the thickness thereof. Thus the present invention can provide a high-performance solar battery having no lattice defects that might cause recombination of electron-hole pairs once produced.

Obviously many modifications and variations of the present invention are possible in the light of the above teachings. It is therefore to be understood that within the scope of the appended claims the invention may be practiced otherwise than as specifically described.

What is claimed as new and desired to be secured by letters patent of the United States is:

1. A method of producing a PN junction type solar battery comprising the steps of setting a mask on a substrate, said mask having a semiconductor-layer-forming opening corresponding in size to the shape-in-plan of a semiconductor layer, forming a semiconductor layer of given conductivity type on said substrate within the opening of said mask, setting a mask similar to said mask on said semiconductor layer on said substrate and at a position slightly shifted from that of said mask so that an opposite type semiconductor layer is formed at a slightly staggered position on said semiconductor layer, repeating the above steps to form a plurality of alternate P-type and N-type semiconductor layers on said substrate in a laminated manner, and mounting terminal electrodes on connection ears in ohmic contact therewith respectively, said connection ears being formed by the staggered formation of said P-type and N-type semiconductor layers.

2. The method of producing a PN junction type solar battery as set forth in claim 1, wherein the steps of forming the P-type and N-type semiconductor layers are performed by either of the ion-beam deposition method and the cluster-ion-beam deposition method.

* * * * *